INVENTOR.
WALTER J. HIRTREITER
BY
Beau, Brooke, Buckley & Beau
ATTORNEYS.

INVENTOR.
WALTER J. HIRTREITER
BY
Beau, Brooks, Buckley & Beau,
ATTORNEYS.

May 12, 1959 W. J. HIRTREITER 2,886,657

AMPLIFIER CONTROL APPARATUS

Filed Aug. 27, 1953 3 Sheets-Sheet 3

INVENTOR.
WALTER J. HIRTREITER
BY
Beau, Brooke, Buckley & Beau,
ATTORNEYS.

United States Patent Office 2,886,657
Patented May 12, 1959

2,886,657

AMPLIFIER CONTROL APPARATUS

Walter J. Hirtreiter, Buffalo, N.Y.

Application August 27, 1953, Serial No. 376,848

21 Claims. (Cl. 179—171)

This invention relates to measuring and control apparatus and more particularly to apparatus capable of high gain amplification of minute input signals with a high degree of linearity together with physical and electrical stability. The apparatus of the invention embodies an improved inverter device which facilitates amplification of weak D.C. signals and comprises an over-all feedback facility.

Accordingly one object of the invention is to provide an improved measuring and/or control amplifier apparatus.

Another object of the invention is to provide a high gain amplifier as aforesaid which is comparatively unaffected by the external physical environment and which inherently embodies a high degree of reliability and stability.

Still another object of the invention is to provide an improved electro-mechanical modulator which is substantially uninfluenced in its operation by external movements, whether translational or rotational.

Yet another object of the invention is to provide an improved amplifier apparatus as aforesaid having a very rapid and accurate response to the input signal.

Still another object of the invention is to provide an improved amplifier apparatus which provides A.C. and D.C. output signals, and which embodies an over-all feedback.

Other objects of the invention will be apparent from the following specification and claims, and from the drawing wherein:

The problem of amplifying and/or accurately measuring small direct currents and potentials may be substantially lessened if a system of D.C. to A.C. conversion before amplification is employed. Conversion of a direct current signal to an alternating current signal so that it can be amplified by a capacity coupled, inductively coupled, or transformer coupled amplifier results in a system which has advantages of stability and simplicity not found in the direct coupled amplifier systems sometimes used for this purpose. The apparatus of the present invention includes means which modulate a suitable A.C. signal in accordance with the D.C. input signal to be sensed or measured, thereby providing an A.C. signal which is more readily amplified than the D.C. signal of which it is a function.

Figure 1:
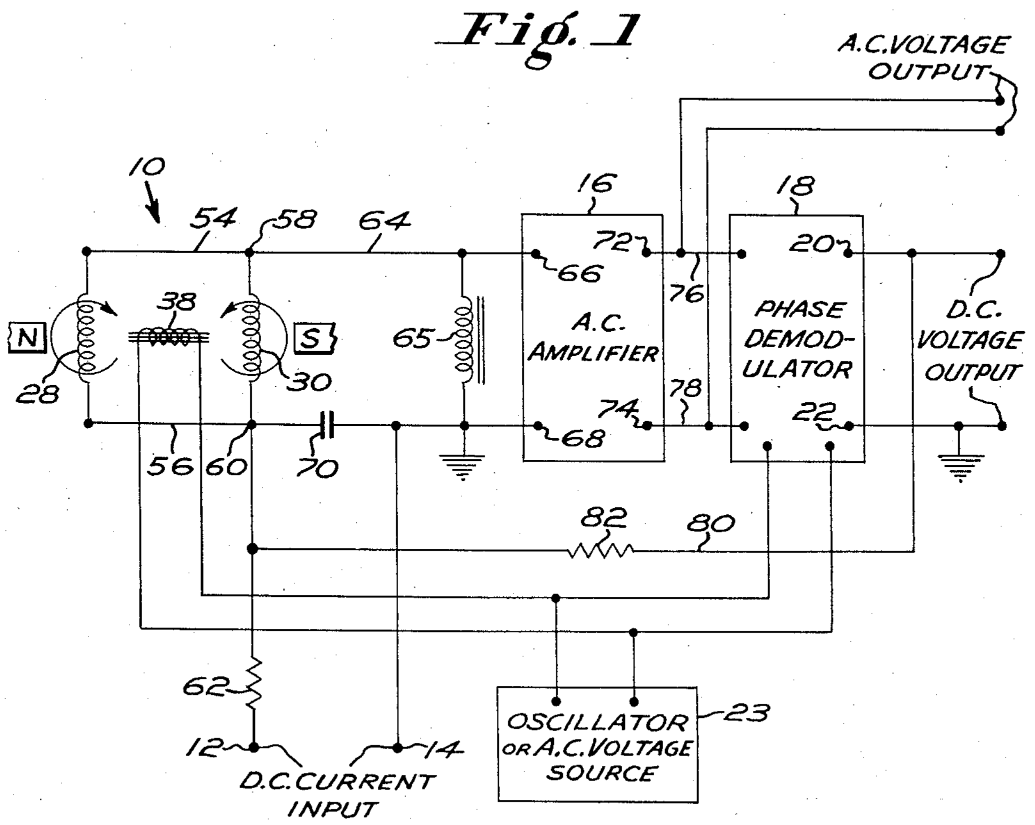
Fig. 1 is a schematic drawing of one embodiment of the amplifier apparatus of the invention, adapted to amplify input currents.

Referring more particularly to Fig. 1, one embodiment of the invention comprises an electro-mechanical modulator 10 which converts a direct current signal applied at input terminals 12, 14 to an A.C. signal of corresponding magnitude and polarity, which signal is amplified by a capacity coupled amplifier 16 and then rectified, preferably by means of a phase demodulator 18 including a suitable filter, the output at the terminals 20, 22 of which is an amplified D.C. function of the amplitude and polarity of the input signal. A suitable A.C. voltage source such as an oscillator 23 is connected as the excitation source for the modulator 10 and as a reference for the demodulator 18.

Figure 2:
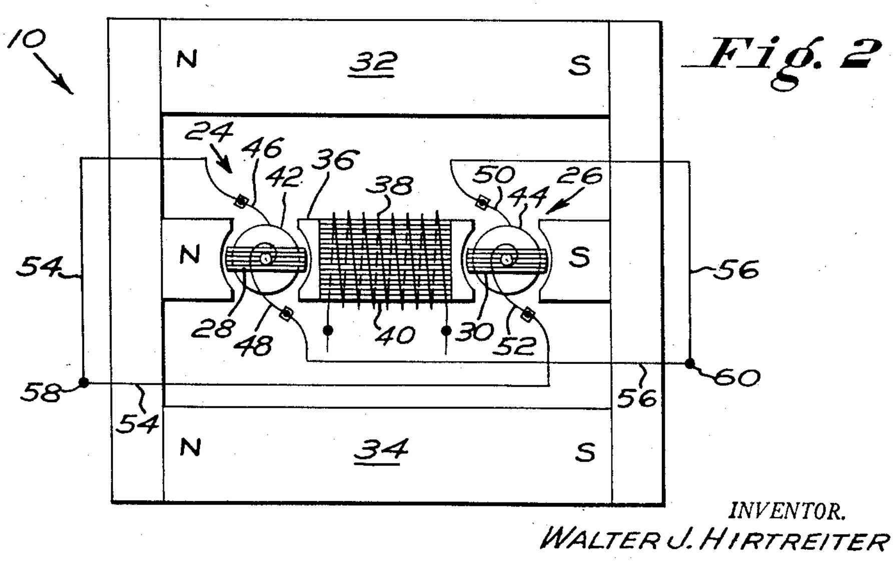
Fig. 2 is a semi-diagrammatic view of the electro-mechanical modulator device of Fig. 1.

The electro-mechanical modulator 10 of the invention is shown in greater detail in Fig. 2 and comprises a magnetic circuit having gap means 24, 26 in which a pair of independently movable coils 28, 30 are pivotally mounted. The magnetic circuit of the modulator 10 includes means setting up a field across the gap means which has unidirectional and alternating components.

In the modulator shown in Fig. 2, the magnetic circuit comprises symmetrically disposed parallel legs each including a permanent magnet 32, 34, and a common leg 36 including the gaps 24, 26 and an A.C. excitation coil 38. The excitation coil 38 is centrally located on the common leg 36 to induce a symmetrical alternating field in the magnetic circuit, and preferably the portion 40 of the common leg 36 upon which the excitation coil 38 is wound is of low iron loss characteristics, such as the laminated transformer iron illustrated. The flux in the gaps 24, 26 is made as uniform and equal as possible, and cylindrical core pieces 42, 44 are provided about which the coils 28, 30 rotate, and these core pieces are preferably stationarily supported by any suitable means in journaled relation to the movable coils, similar to a D'Arsonval galvanometer structure.

The movable coils 28, 30 are constructed and mounted to be as exactly identical as possible in all respects including balance, impedance, and all other mechanical and electrical characteristics in operation. The connections to the coils are made by thin spiral ribbons 46, 48, and 50, 52, respectively. The coils are normally disposed as shown in Figs. 1 and 2 with the magnetic axes thereof in quadrature to the axis of the magnetic flux of the common leg 36 so that there is normally zero coupling between the coils 28, 30 and the alternating magnetic flux provided by the winding 38. The connection ribbons 46, 48, 50 and 52 are very thin and flexible and provide as nearly zero restoring torque to the coils as possible, the major coil position restoring action being by means of a motor action as will appear more fully hereinafter.

As shown in Figs. 1 and 2 the movable coils 28, 30 are connected by conductors 54, 56 in parallel but in opposite polarity so that any mechanically forced rotation of one provides a direct current generator action in combination with the unidirectional field of the magnetic circuit, which sets up a current causing a motor action torque in the companion coil in the opposite direction from the first imposed torque. Accordingly when an external force such as a rotational movement of the whole unit sets up like and equal inertia torques in each of the coils, each coil attempts to drive the other in the opposite direction and a circulating current is set up in what is in effect a short circuited coil in a magnetic field. Accordingly a high degree of resistance to movement under inertia forces arising from rotation of the unit, is achieved. All of the moving elements are balanced and symmetrical, and therefore the coils are also undisturbed by translational movements of the unit. Furthermore, since the coils have equal impedances and are reversely connected, the voltages induced in the coils upon identical displacement thereof from their normal positions are equal and of opposite polarity, and therefore the resultant voltage across the terminals 58, 60 of the coil circuit is zero. This applies to both the D.C. generator action resulting from like and equal angular velocity of the coils and the A.C. transformer action resulting from like and equal displacement, as well as to the impedance drops in the coils due to the resultant circulating currents.

Although the coil structures of the modulator unit of the invention have the quality of a short circuited coil as to external forces imposing like and equal torques thereon, they operate as a single circuited coil not short circuited in the normal internal operation of the apparatus, wherein they are given equal but opposite rotation by the input D.C. signal. Referring to Fig. 1, the modulator 10 is connected by its terminals 58, 60 in a D.C. input circuit comprising the input terminal 12 in series with a resistor 62 and the parallel combination of the coils 28, 30, with a grounded return through a conductor 64 and an A.C. blocking impedance such as the inductor 65 to the terminal 14. It will be understood that the inductor 65 may be the primary of a coupling transformer in the input of the amplifier 16. An input signal current flowing through this D.C. circuit sets up a motor action in the coils 28, 30 by coaction with the unidirectional magnetic field in which they lie. Since the coils 28, 30 are oppositely connected, they will tend to rotate in opposite directions, as indicated by arrows in the figure, and as soon as they have departed from an attitude of quadrature with the alternating magnetic flux set up by the excitation coil 38, a corresponding alternating potential will be induced in each of them. This alternating potential appears across the modulator terminals 58, 60 and is connected across the input terminals 66, 68 of the amplifier 16 by means of the conductor 64 and a D.C. blocking condenser 70.

This A.C. signal is then amplified, and the amplified A.C. signal may be taken as the useful output of the apparatus at output terminals 72, 74 of the amplifier 16. In any case the A.C. output of the amplifier 16 is connected by conductors 76, 78 to the phase demodulator 18 by which it is rectified, so that a D.C. output is obtained at the demodulator output terminals 20, 22 which also may be used as the useful output of the apparatus and further provides a source of negative feed back. For this purpose a conductor 80 connects the output of the demodulator 18 at the ungrounded output terminal 20 thereof through a feed back resistor 82 to the modulator terminal 60 in the ungrounded side of the D.C. input circuit. The operation of the phase demodulator is so chosen, according to well known principles, that the polarity of the output thereof is opposite to that of the D.C. input at 12, 14. Thus as soon as the coils 28, 30 are deflected by the input current a much enlarged voltage appears at 20 which is opposite in polarity to the input at terminal 12. Accordingly this negative feed back voltage modifies the current flow in the D.C. input circuit, limiting or reversing the D.C. current through the coils 28, 30 and the resulting motor action on the coils, thereby providing a quick adjustment of their disposition to a condition corresponding to a predetermined relation of the output signal with the input signal. Therefore the value of the feed back resistor 82 affects the over-all gain of the apparatus and may be selected or made variable to suit requirements.

Figure 3:
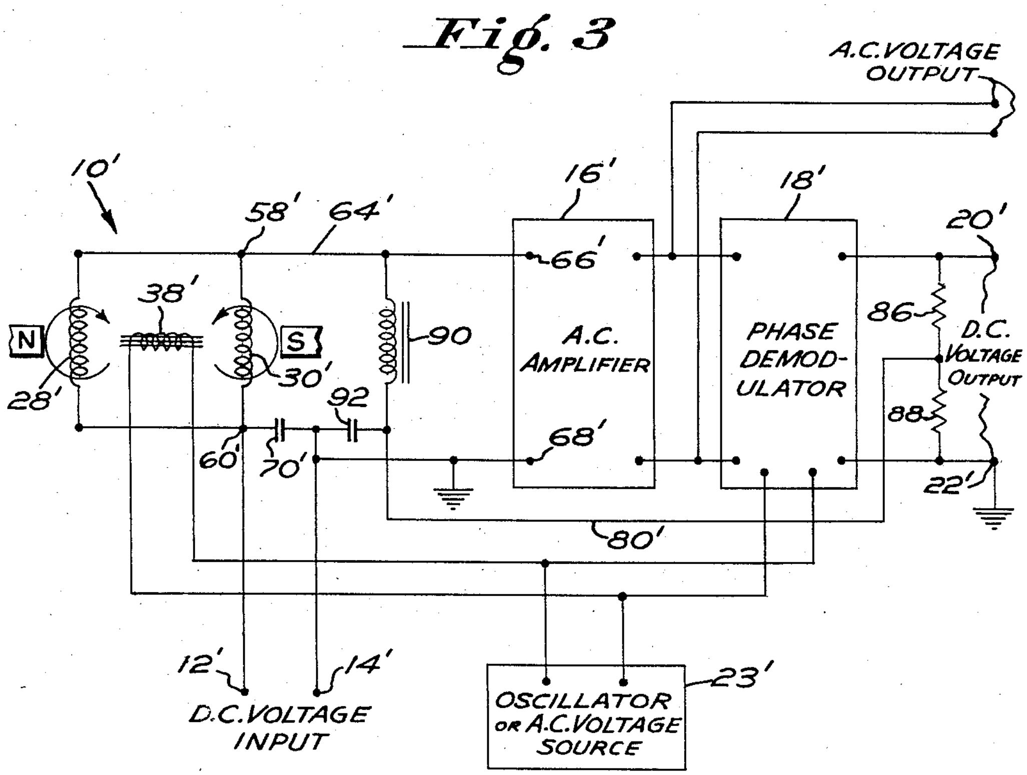
Fig. 3 is a schematic drawing illustrating another embodiment of the invention, adapted to amplify input potentials.

It will be seen that a continuous D.C. input circuit is provided in the arrangement of Fig. 1 and that the feed back is arranged as a parallel path for the input current, and accordingly the device of Fig. 1 is a current responsive device. The amplifier apparatus of the invention can also be arranged as a high impedance input device sensitive to D.C. input voltages. One embodiment of the invention having a high input impedance at the D.C. terminals is shown in Fig. 3, wherein the D.C. input circuit comprises an input terminal 12′ in series with the oppositely connected parallel combination of movable coils 28′, 30′ of an electro-mechanical modulator 10′ identical to the modulator 10 of Fig. 1. The D.C. circuit is completed through a feed back circuit to ground and thus to the other D.C. input terminal 14′. In this case the feed back voltage is taken from a voltage divider comprising resistors 86, 88 connected across the output of a phase demodulator 18′, and is connected through a conductor 80′ and an A.C. blocking inductor 90 to the D.C. input circuit at conductor 64′ at the opposite side of the coils 28′, 30′ from the input terminal 12′. This feed back voltage is chosen to be of the same polarity as the input D.C. voltage and therefore opposes the D.C. input current through the movable coils 28′, 30′, thereby bringing about a balancing or restorative motor action thereto. If desired, an A.C. by-pass condenser 92 may be connected from the feed back conductor 80′ to ground.

The A.C. circuit for the coils 28′, 30′ comprises a conductor 64′ and a D.C. blocking condenser 70′ connecting the coil circuit terminals 58′, 60′ of the modulator across the input terminals 66′, 68′ of an A.C. amplifier 16′. As shown, the output terminals of the amplifier 16′ are connected to the input of the phase demodulator 18′, and an oscillator 23′ provides the reference voltage for the demodulator 18′ and the excitation voltage for the A.C. field coil 38′ of the modulator 10′.

The principle of operation of the circuit of Fig. 3 is the same as that of Fig. 1 with the exception that the D.C. input is of high effective impedance and the feed back is a potential feed back rather than a current one. As in the apparatus of Fig. 1, the output signal of the amplifier 16′ may be connected to apparatus output terminals if desired, and the corresponding rectified output signal of the phase demodulator 18′ may also be taken as the useful output of the apparatus, as well as for feed back purposes, as shown.

While the combined unidirectional and alternating flux circuit of Fig. 2 provides the maximum conservation of space and weight, the stabilized electro-mechanical modulator of the invention may alternatively be provided with isolated unidirectional and alternating magnetic circuits. An advantage of this type of arrangement is that the design considerations of the unidirectional and alternating field or structures are different and in this arrangement maximum magnetic efficiency in each core circuit may be obtained.

Figure 4:
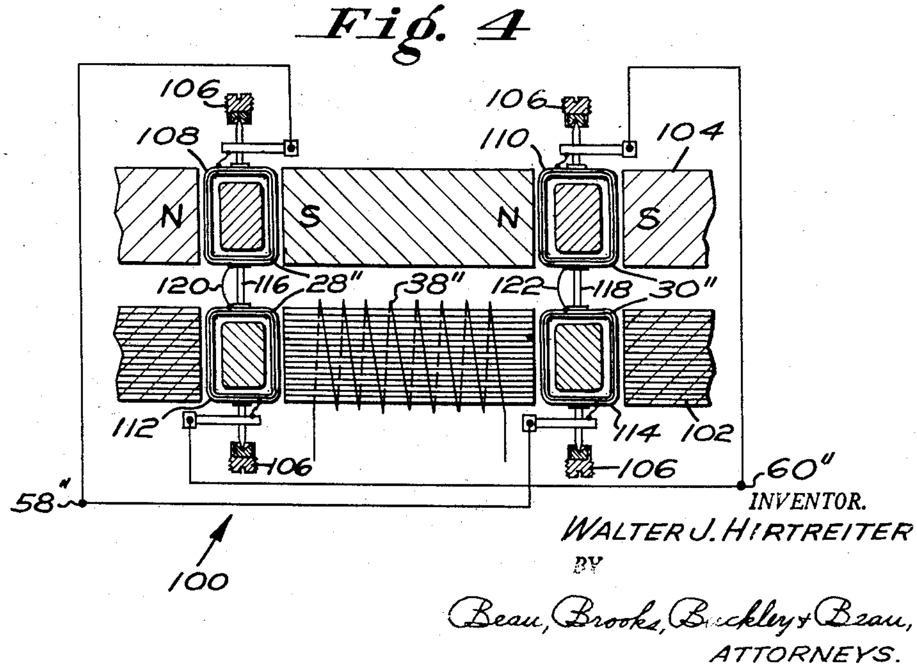
Fig. 4 is a semi-diagrammatic fragmentary view of a modified electro-mechanical modulator of the invention.

Referring to Fig. 4, the electro-mechanical modulator 100 shown is provided with an alternating field structure 102 including an excitation winding 38″ and a magnetically separate unidirectional magnetic field structure 104, which set up corresponding fields in which two coil movements 28″, 30″ are mounted, as by jeweled bearings 106. Each coil movement comprises a D.C. or motor element winding 108, 110 mounted in the field provided by the unidirectional field structure 106, and an A.C. or modulator element winding 112, 114 mounted in the field provided by the alternating field structure 102. As shown, the two windings 108, 112 and 110, 114 of each coil movement are mechanically connected together by common mounting shafts 116, 118 so that each coil movement rotates as a unit.

Where desired, the two windings of each coil movement may be provided with independent leads, as will appear more fully hereinafter. However, in this case they are connected in series by conductors 120, 122, and the two complete movable coils 28″, 30″ formed in this manner are oppositely connected in parallel between terminals 58″, 60″. Connected in this way, the electrical operation of each complete coil movement 28″, 30″ and of the modulator 100 as a whole is the same as that of the movable coils 28, 30 and the modulator 10 of Fig. 2, respectively. Accordingly, where desired the arrangement of Fig. 4 may be substituted for that of Fig. 2, for example, in the amplifier devices of Figs. 1 and 3.

Alternatively, the electro-mechanical modulator of the invention may comprise a field and coil movement structure of the type shown in Fig. 4 with the D.C. and A.C. coil movement windings thereof oppositely connected in separate parallel combinations.

Figure 5:
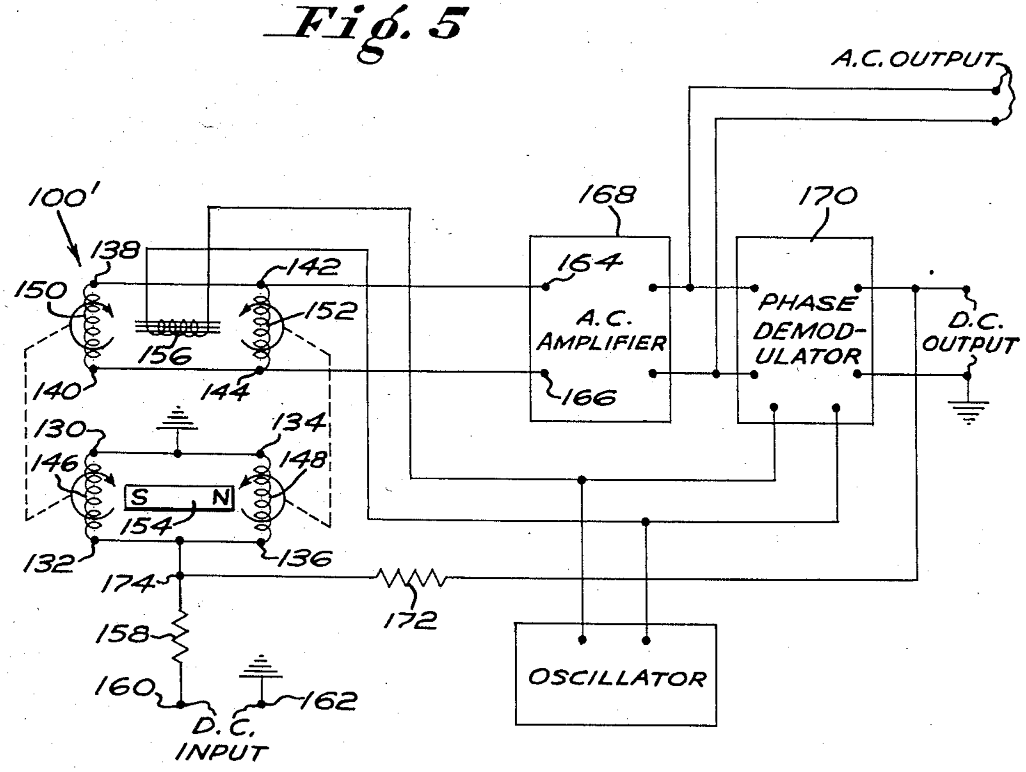
Fig. 5 is a schematic drawing illustrating a further modified embodiment of the invention.

Thus, in the apparatus shown diagrammatically in Fig. 5, separate terminals 130, 132, 134, 136 and 138, 140, 142, 144 are provided for each of the D.C. and A.C. windings 146, 148 and 150, 152 of a modulator 100' having separate unidirectional and alternating field structures 154, 156 associated with the corresponding windings, as shown. The D.C. windings 146, 148 are connected oppositely in parallel, and this parallel combination is connected in series with a resistor 158 across the D.C. signal input terminals 160, 162. The A.C. windings 150, 152 are mechanically connected to the corresponding D.C. windings 146, 148 of the modulator to rotate therewith as indicated, and are electrically connected oppositely in a second parallel combination, electrically separate from that of the D.C. windings. This A.C. winding circuit is connected across the input 164, 166 of an A.C. amplifier 168, the output of which is rectified by a phase demodulator 170. Negative current feedback is provided from the output of the phase demodulator through a feedback resistor 172 to a current division point 174 in the D.C. input circuit between the input resistor 158 and the D.C. winding parallel combination. Thus, the circuit of the apparatus shown in Fig. 5 is identical with that shown in Fig. 1, with the exception that the electrical separation of the D.C. motor and A.C. modulating functions of the modulator unit provided by the separate windings 146, 148 and 150, 152 eliminates the need for A.C. and D.C. isolating elements. Accordingly, the operation of the apparatus of Fig. 6 is identical to that of Fig. 1.

It will be understood that the electro-mechanical modulator 100' of Fig. 5 may also be connected in an amplifier apparatus having negative potential feedback of the type shown in Fig. 3, the parallel combination of the A.C. coils being connected directly across the input of the amplifier, and the parallel combination of the D.C. coils being connected directly between the D.C. input signal terminal and the voltage divider source of feedback potential.

It will be understood that in connecting the pairs of coil windings 28, 30 of Figs. 1 and 2; 28', 30' of Fig. 3; 108, 110 and 112, 114 of Fig. 4; and 146, 148 and 150, 152 of Fig. 5 oppositely in parallel, in accordance with the invention, it is immaterial whether the windings of each pair are wound in the same direction with their relatively opposite ends connected together as shown in Figs. 2 and 4; or whether they are wound in opposite directions with their adjacent ends connected together. Alternatively, the two coil movements may be wound in the same direction with the corresponding winding ends connected together but with the movements mounted in separate fields of relatively opposite polarity. In each example the result is that the windings are connected in relatively opposite polarity, in accordance with the invention.

It will be seen that in each form of the electro-mechanical modulator of the invention a magnetic brake or motor action is provided whereby like rotation of the twin coil movements is strongly resisted, and the coils are connected so that even if such rotation does take place the resulting voltages appearing across the modulated signal output terminals of the modulator will be zero. Also, it will be seen that like rotation of the coils sets up a circulating alternating current therein which exerts a strong restorative effect, while the normal opposite rotation results in very little A.C. motor effect, due to the relatively high impedance of the A.C. modulator output circuit.

In the amplifier apparatus of the invention, negative feedback is provided which not only provides a desirable degree of linearity between the input and output of the apparatus, but also provides a motor action which limits and restores the coil position. Thus, the twin oppositely connected coil arrangement of the modulator of the invention and the feedback provision cooperate to permit an unusually mechanically free and thus highly responsive coil movement without sensitivity to external spurious forces. Since the mechanical returning torque on the coil movements is made as small as possible, very little current is needed to maintain the coils in a given operative position. Therefore, the overall gain of the amplifier apparatus approaches the ratio of the value of the feedback resistance to that of the input resistor in a current feedback arrangement such as that of Figs. 1 and 5, or the ratio of the values of the voltage divider resistances in a potential feedback arrangement such as that of Fig. 3.

In each process of amplification, the overall feedback circuits tend to hold the amplification of the complete system constant and at a value determined only by the relationship of feedback and input resistances. Changes in gain of the capacity-coupled amplifier due to parameter changes in vacuum tubes or components, changes in the demodulator gain, changes in the amplifier plate circuit power supply, or changes in the reference oscillator output voltage, all have a negligible effect on the overall gain of the amplifying system since overall negative feedback counteracts these effects by a slight repositioning of the movable coils.

As shown most clearly in Fig. 5, the D.C. motor and A.C. modulating elements of the modulator of the invention may be electrically distinct. Accordingly, it will be understood that any suitable displacement-actuated A.C. modulating elements, such as capacitance or inductance varying means, for example, may be operated by the D.C. motor elements in accordance with the invention with similar advantages of high sensitivity combined with freedom from the effects of external forces.

Thus, while only a few forms of the invention have been illustrated and described in detail, it will be understood that the invention is not so limited but may be otherwise embodied within the spirit of the invention and the scope of the appended claims.

What is claimed is:

1. In an electro-mechanical modulator, magnetic field means having gap means, said field means comprising means setting up magnetic flux across said gap means having a steady component and an alternating component, a pair of coil means pivotally mounted in said gap means for independent rotation and each linking both of said flux components, the instantaneous polarity of said flux components relative to each other being the same at each of said coil means, conductors connecting said coil means in parallel in relatively opposite polarity, and direct current input means connected across said coil means, whereby a direct current signal applied to said input cooperates with said steady flux component to set up a motor action in each of said coil means to rotate said coil means in opposite relative direction to change the flux linking relation thereof with said alternating flux component.

2. In an electro-mechanical modulator, magnetic field means having gap means, said field means comprising means setting up magnetic flux across said gap means having a steady component and an alternating component, a pair of coil means pivotally mounted in said gap means for independent rotation, said coil means each comprising motor winding means linking said steady flux component and modulator winding means rotationally integral therewith and linking said alternating flux component, conductors connecting said motor winding means in parallel in relatively opposite polarity and said modulator winding means in parallel in relatively opposite polarity, direct current input means connected across the parallel combination of said motor winding means, and output circuit means connected across the parallel combination of said modulator winding means, whereby a direct current signal applied to said input cooperates with said steady flux component to set up a motor action in each of said motor winding means to rotate said coil means in opposite relative directions to change the flux linking relation of said modulator winding means with said alternating flux component.

3. In an electro-mechanical modulator, alternating current modulator means comprising dual rotor means mounted for independent rotation, said rotor means each comprising direct current motor armature winding means, said winding means being electrically connected in parallel in opposite relative polarity, direct current input circuit means connected across the parallel combination of said winding means for motored operation of said rotor means in opposite relative directions, at least one of said rotor means comprising displacement operable modulation control means of said modulator means adapted to be operable by motored operation of said one of said rotor means, and output circuit means responsive to said modulator means and comprising feedback circuit means connected to said parallel combination and operable to provide restoring motor action to said rotor means.

4. In an electro-mechanical amplifying device, magnetic field means having gap means, said field means comprising means setting up magnetic flux across said gap means having a steady component and an alternating component, a pair of coil means pivotally mounted in said gap means for independent rotation, said coil means each comprising motor winding means linking said steady flux component and modulator winding means rotationally integral therewith and linking said alternating flux component, conductors connecting said motor winding means in parallel in relatively opposite polarity and said modulator winding means in parallel in relatively opposite polarity, output current means connected across the parallel combination of said modulator winding means, amplifier means connected to amplify the alternating signal of said output current means, phase demodulator means connected to rectify the output of said amplifier means, feedback circuit means connected to the output of said phase demodulator means, input signal terminal means, and direct current circuit means connecting said terminal means and said feedback circuit means across the parallel combination of said motor winding means differentially.

5. In a precision electro-mechanical apparatus, dual pivoted movement electro-magnetic galvanometer means each having signal input means, the dual movements of said galvanometer means having pivotal mounts having axes of substantially the same direction and arranged to permit independent rotation of the two movements, and signal input circuit means comprising said signal input means connected in parallel in relative polarity chosen for actuation of said movements in relatively opposite directions upon application of an input signal to said input circuit means, and output signal means responsive differentially to opposite relative rotation of said movements.

6. In an electro-mechanical modulator, dual alternating current modulator means each comprising motor means, each motor means comprising motor stator element means and a separate motor rotor element means, the dual rotor means being mounted for independent relative rotation and having axes extending in substantially the same direction, one of said element means of each motor means comprising steady field means and the other of said element means comprising direct current motor winding means, at least said winding means being separate and individual to each motor means, said winding means being electrically connected in parallel in opposite relative polarity with respect to said field means of the corresponding motor means, direct current input circuit means connected across the parallel combination of said winding means, said modulator means each comprising signal output means, said rotor means each comprising displacement operable modulated signal control means arranged to be operable by rotary displacement of said rotor means and adapted to vary the signal output of the corresponding modulator means oppositely with like displacement of said rotor means and similarly with opposite relative displacement of said rotor means, and modulated signal output circuit means comprising said signal output means connected in parallel.

7. In a precision electro-mechanical device, dual motor means, said motor means comprising motor stator element means and dual movable element means, said movable element means being mounted for independent relative displacement in like and opposite directions, one of said element means comprising field means and the other of said element means comprising winding means for cooperation therewith to produce motor action, at least said winding means being separate and individual to each motor means, said winding means being electrically connected in parallel in opposite relative polarity with respect to the cooperating field means, input circuit means connected across the parallel combination of said winding means, whereby like displacement of said movable element means is resisted electromagnetically and whereby application of a signal to said input circuit means causes motor actions on said movable element means in relatively opposite directions, and output means responsive to motored operation of at least one of said movable element means, said output means comprising negative feedback signal means connected across said parallel combination.

8. In an electro-mechanical modulator, magnetic field means having gap means, said field means comprising means setting up magnetic flux across said gap means having geometrically separate steady and alternating components, a pair of coil means pivotally mounted in said gap means for independent rotation, said coil means each comprising motor winding means linking said steady flux component and a separate modulator winding means rotationally integral therewith and linking said alternating flux component, conductors connecting said motor winding means in parallel in relatively opposite polarity and said modulator winding means in parallel in relatively opposite polarity, direct current input means connected across the parallel combination of said motor winding means, and output circuit means connected across the parallel combination of said modulator winding means, whereby a direct current signal applied to said input cooperates with said steady flux component to set up a motor action in each of said motor winding means to rotate said coil means in opposite relative directions to change the flux linking relation of said modulator winding means with said alternating flux component.

9. In an electro-mechanical modulator, magnetic field means having gap means, said field means comprising means setting up magnetic flux across said gap means having geometrically separate steady and alternating components, a pair of coil means pivotally mounted in said gap means for independent rotation, said coil means each comprising motor winding means linking said steady flux component and a separate modulator winding means rotationally integral therewith and linking said alternating flux component, conductors connecting said motor winding means in relatively opposite polarity in a first parallel combination and said modulator winding means in relatively opposite polarity in a separate parallel combination, direct current input means connected across said first parallel combination, and output circuit means connected across said separate parallel combination, whereby a direct current signal applied to said input cooperates with said steady flux component to set up a motor action in each of said motor winding means to rotate said coil means in opposite relative directions to change the flux linking relation of said modulator winding means with said alternating flux component.

10. In an electro-mechanical modulator, magnetic field means having gap means, said field means comprising steady field means and alternating field means acting across said gap means, a pair of coil means mounted in said gap means for independent rotation in like and opposite directions, said coil means each comprising motor winding means magnetically associated with said steady field means and modulator winding means rotationally integral therewith and magnetically associated with said alternating field means, means connecting said motor winding means in parallel in relatively opposite polarity and said modulator winding means in parallel in relatively opposite polarity, direct current input means connected across the parallel combination of said motor winding means, and output circuit means connected across the parallel combination of said modulator winding means, whereby a direct current signal applied to said input cooperates with said steady field means to set up a motor action in each of said motor winding means to rotate said coil means in opposite relative directions to change the flux linking relation of said modulator winding means with said alternating field means.

11. In an electro-mechanical modulator, magnetic field means having gap means, said field means comprising steady field means and alternating field means acting across said gap means, a pair of coil means mounted in said gap means for independent rotation in like and opposite directions, said coil means each comprising motor winding means magnetically associated with said steady field means and modulator winding means rotationally integral therewith and magnetically associated with said alternating field means, means connecting said motor winding means in parallel in relatively opposite polarity and said modulator winding means in parallel in relatively opposite polarity, direct current input means connected across the parallel combination of said motor winding means, and output circuit means connected across the parallel combination of said modulator winding means, whereby a direct current signal applied to said input cooperates with said steady field means to set up a motor action in each of said motor winding means to rotate said coil means in opposite relative directions to change the flux linking relation of said modulator winding means with said alternating field means, said output circuit means comprising negative feedback means connected across said motor winding means.

12. In an electro-mechanical modulator, magnetic field means having gap means, said field means comprising steady field means and alternating field means acting across said gap means, a pair of coil means mounted in said gap means for independent rotation in like and opposite directions, the instantaneous polarity of said field means relative to each other being the same at each of said coil means, means connecting said coil means in parallel in relatively opposite polarity, and direct current input means and alternating current output circuit means connected across said coil means, whereby a direct current signal applied to said input cooperates with said steady field means to set up a motor action in each of said coil means to rotate said coil means in opposite relative direction to change the flux linking relation thereof with said alternating field means.

13. In an electro-mechanical modulator, magnetic field means having gap means, said field means comprising steady field means and alternating field means acting across said gap means, a pair of coil means mounted in said gap means for independent rotation in like and opposite directions, the instantaneous polarity of said field means relative to each other being the same at each of said coil means, means connecting said coil means in parallel in relatively opposite polarity, and direct current input means and alternating current output circuit means connected across said coil means, whereby a direct current signal applied to said input cooperates with said steady field means to set up a motor action in each of said coil means to rotate said coil means in opposite relative direction to change the flux linking relation thereof with said alternating field means, said output circuit means comprising rectifier means including negative feedback means connected across said coil means.

14. In an electro-mechanical modulator, magnetic field means having gap means and comprising alternating field means acting across said gap means, a pair of coil means mounted in said gap means for independent like and opposite rotation, the instantaneous polarity of said field means relative to each other being the same at each of said coil means, means connecting said coil means in parallel in relatively opposite polarity, output circuit means connected across said coil means, and means adapted to apply relatively opposite torques to said coil means.

15. In an electro-mechanical modulator, dual modulator means, said modulator means comprising stator element means and dual movable element means, said movable element means being mounted for independent relative displacement in like and opposite directions, one of said element means comprising alternating field means and the other of said element means comprising winding means for cooperation therewith, at least said winding means being separate and individual to each modulator means, said winding means being electrically connected in parallel in opposite relative polarity with respect to the cooperating field means, and output circuit means connected across the parallel combination of said winding means, and means adapted to apply relatively opposite forces to said movable element means.

16. In a precision electro-mechanical device, dual motor means, said motor means comprising motor stator element means and dual movable element means, said movable element means being mounted for independent relative displacement in like and opposite directions, one of said element means comprising field means and the other of said element means comprising winding means for cooperation therewith to produce motor action, at least said winding means being separate and individual to each motor means, said winding means being electrically connected in parallel in opposite relative polarity with respect to the cooperating field means, and input circuit means connected across the parallel combination of said winding means, whereby like displacement of said movable element means is resisted electro-magnetically and whereby application of a signal to said input circuit means causes motor actions on said movable element means in relatively opposite directions, and means responsive differentially to relatively opposite displacement of said movable element means.

17. In a precision electro-mechanical device, dual motor means, said motor means comprising motor stator element means and dual movable element means, said movable element means being mounted for independent relative displacement in like and opposite directions, one of said element means comprising field means and the other of said element means comprising winding means for cooperation therewith to produce motor action, at least said winding means being separate and individual to each motor means, said winding means being electrically connected in parallel in opposite relative polarity with respect to the cooperating field means, and input circuit means connected across the parallel combination of said winding means, whereby like displacement of said movable element means is resisted electro-magnetically and whereby application of a signal to said input circuit means causes motor actions on said movable element means in relatively opposite directions, and output means responsive differentially to relatively opposite displacement of said movable element means, said output means comprising negative feed back signal means connected across said parallel combination.

18. In an electro-mechanical apparatus, dual alternating current electro-magnetic means, said electro-magnetic means comprising stator element means and dual movable element means, said movable element means being mounted for independent relative displacement in like and opposite directions, one of said element means comprising alternating field means and the other of said element means comprising winding means for cooperation therewith, at least said winding means being separate and individual to each electro-magnetic means, said winding means being electrically connected in parallel in opposite relative polarity with respect to the cooperating field means, whereby the dual movable element means are adapted and arranged to resist displacement in like directions electromagnetically.

19. In a precision electro-mechanical apparatus, dual electro-magnetic galvanometer means each having signal input means and a galvanometer movement operable thereby, said galvanometer means having mounts comprising means guiding the dual movements of said galvanometer means for independent displacement of the two movements in like and relatively opposite directions, and signal input circuit means connecting said signal input means in circuit in a relationship chosen for actuation of said movements in relatively opposite directions upon application of an input signal to said input circuit means, and output signal means responsive differentially to opposite relative displacement of said movements.

20. In a precision electro-mechanical apparatus, dual pivoted movement electro-magnetic galvanometer means each having signal input means, the dual movements of said galvanometer means having pivotal mounts having axes of substantially the same direction and arranged to permit independent rotation of the two movements, and signal input circuit means connecting said signal input means in circuit in relative polarity chosen for actuation of said movements in relatively opposite directions upon application of an input signal to said input circuit means, and output signal means responsive differentially to opposite relative rotation of said movements.

21. In a precision electro-mechanical apparatus, dual pivoted movement electro-magnetic galvanometer means each having signal input means, the dual movements of said galvanometer means having pivotal mounts having axes of substantially the same direction and arranged to permit independent rotation of the two movements, and signal input circuit means connecting said signal input means in circuit in relative polarity chosen for actuation of said movements in relatively opposite directions upon application of an input signal to said input circuit means, and output signal means responsive differentially to opposite relative rotation of said movements, and feedback circuit means responsive to said output signal means and connected to said signal input circuit means to be operable to provide restoring motor action to said galvanometer movements.

References Cited in the file of this patent

UNITED STATES PATENTS

| | | |
|---|---|---|
| 2,297,251 | Schild | Sept. 29, 1942 |
| 2,297,543 | Eberhardt et al. | Sept. 29, 1942 |
| 2,405,049 | Pattee | July 30, 1946 |
| 2,486,641 | Gilbert | Nov. 1, 1949 |
| 2,560,257 | Sias | July 10, 1951 |